United States Patent
Enzu et al.

(10) Patent No.: US 12,264,168 B2
(45) Date of Patent: Apr. 1, 2025

(54) RUTHENIUM COMPOUND, THIN-FILM FORMING RAW MATERIAL, AND METHOD OF PRODUCING THIN FILM

(71) Applicant: ADEKA CORPORATION, Tokyo (JP)

(72) Inventors: Masaki Enzu, Tokyo (JP); Masako Hatase, Tokyo (JP); Keisuke Takeda, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 525 days.

(21) Appl. No.: 17/620,934

(22) PCT Filed: Jun. 10, 2020

(86) PCT No.: PCT/JP2020/022828
§ 371 (c)(1),
(2) Date: Dec. 20, 2021

(87) PCT Pub. No.: WO2020/255822
PCT Pub. Date: Dec. 24, 2020

(65) Prior Publication Data
US 2022/0372056 A1    Nov. 24, 2022

(30) Foreign Application Priority Data
Jun. 21, 2019 (JP) .................. 2019-115184

(51) Int. Cl.
*C07F 15/00* (2006.01)
*C23C 16/18* (2006.01)

(52) U.S. Cl.
CPC .......... *C07F 15/0046* (2013.01); *C23C 16/18* (2013.01)

(58) Field of Classification Search
CPC ....... C07F 15/0046; C07F 17/00; C23C 16/18
See application file for complete search history.

(56) References Cited

U.S. PATENT DOCUMENTS

2015/0225437 A1 *  8/2015  Harada ................ C23C 16/46
                                              556/136

FOREIGN PATENT DOCUMENTS

| EP | 1935897 A1 * | 6/2008 | .......... C07F 15/0046 |
|---|---|---|---|
| JP | 2005-60814 | 3/2005 | |
| JP | 2008-69453 | 3/2008 | |
| JP | 2009-536267 | 10/2009 | |
| JP | 2011-521983 | 7/2011 | |
| JP | 2016-74929 | 5/2016 | |
| TW | I227239 | 2/2005 | |
| WO | WO-2009094259 A1 * | 7/2009 | .......... C07F 15/0046 |

OTHER PUBLICATIONS

International Search Report issued Aug. 11, 2020 in International (PCT) Application No. PCT/JP2020/022828.
Kirss et al., "Synthesis, characterization and electrochemistry of bis(3-aryl-6,6-dimethylcyclohexadienyl)ruthenium complexes", Inorganica Chimica Acta, vol. 359, 2006, pp. 4393-4397.
Bauer, Andre et al., "Efficient Synthesis of Ruthenium(II) η⁵-Dienyl Compounds Starting from Di-μ-chlorodichloro-bis[(1-3η:6-8η)-2,7-dimethyloctadienediyl]diruthenium(IV). Versatile Precursors for Enantioselective Hydrogenation Catalysts", Organometallices, 2000, vol. 19, No. 25, pp. 5471-5476.

* cited by examiner

*Primary Examiner* — Alexander R Pagano
*Assistant Examiner* — Frank S. Hou
(74) *Attorney, Agent, or Firm* — Wenderoth, Lind & Ponack, L.L.P.

(57) ABSTRACT

The present invention provides a ruthenium compound represented by the following general formula (1) or (2), a thin-film forming raw material containing the ruthenium compound, and a method of producing a thin-film including using the thin-film forming raw material:

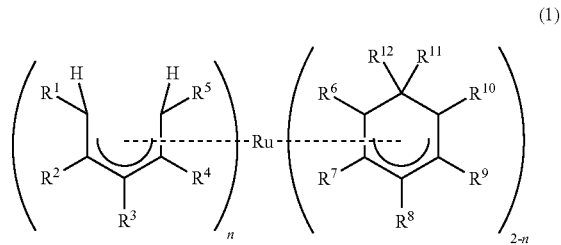

where $R^1$ to $R^{12}$ each independently represent a hydrogen atom, an alkyl group having 1 to 5 carbon atoms, or a fluorine atom-containing group, and "n" represents an integer from 0 to 2, provided that at least one of $R^1$ to $R^{12}$ represents the fluorine atom-containing group;

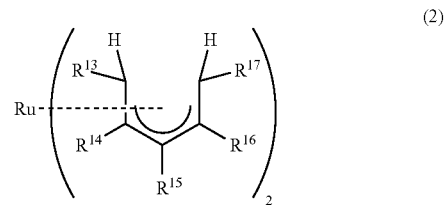

where $R^{13}$ to $R^{17}$ each independently represent a hydrogen atom or an alkyl group having 1 to 5 carbon atoms, and a total number of the carbon atoms of $R^{13}$ to $R^{17}$ is 3 or more.

3 Claims, 2 Drawing Sheets

RUTHENIUM COMPOUND, THIN-FILM FORMING RAW MATERIAL, AND METHOD OF PRODUCING THIN FILM

TECHNICAL FIELD

The present invention relates to a novel ruthenium compound, a thin-film forming raw material containing the compound, and a method of producing a thin-film including using the thin-film forming raw material.

BACKGROUND ART

A thin-film forming raw material, containing a ruthenium element shows specific electrical characteristics, and hence has been applied to a wide variety of technologies. The material has been used as, for example, an electrode material for a memory element typified by a DRAM element, a resistance film, a diamagnetic film used for the recording layer of a hard disk, and a catalyst material for a polymer electrolyte fuel cell.

As a method of producing the thin-film, there are given, for example, a sputtering method, an ion plating method, MOD methods, such as a coating thermal decomposition method and a sol-gel method, and chemical vapor deposition methods. Of those, chemical vapor deposition (hereinafter sometimes simply referred to as "CVD") methods including an atomic layer deposition (ALI) method are optimum production processes because the methods each have a number of advantages, such as excellent composition controllability and step coverage, suitability for mass production, and capability of hybrid integration.

There are a large number of reports on various raw materials as ruthenium atom supply sources to be used in the chemical vapor deposition method. For example, in Patent Literature 1, there is disclosed bis(1-ethylpentadienyl)ruthenium as a material that can be suitably used as a thin-film forming raw material. In addition, in Patent Literature 2, there is disclosed bis(2,4-dimethyl-1,3-pentadienyl)ruthenium, and in Patent Literature 3, there is disclosed a ruthenium compound in which a cyclohexadienyl group and a pentadienyl group are coordinated. In addition, in Patent Literature 4, there are disclosed bis(fluorocyclopentadienyl)ruthenium and bis(trifluoromethylcyclopentadienyl) ruthenium as ruthenium compounds each containing a fluorine atom.

CITATION LIST

Patent Literature

[PTL 1] JP 2008-069453 A
[PTL 2] JP 2011-521983 A
[PTL 3] JP 2016-074929 A
[PTL 4] JP 2005-060814 A

SUMMARY OF INVENTION

Technical Problem

In a method including vaporizing a compound to form a thin-film, such as the CVD method, the compound (precursor) to be used as a raw material is required to satisfy the following conditions: the compound has a low melting point, and hence can be transported under the state of a liquid; the compound has a large vapor pressure, and hence can be easily vaporized; the compound has high thermal stability; and the compound can produce a high-quality thin-film with high productivity. However, none of the related-art ruthenium compounds has been sufficiently satisfactory in terms of those conditions.

Accordingly, an object of the present invention is to provide a novel ruthenium compound, which has a low melting point, a large vapor pressure, and high thermal stability, and which can produce a high-quality thin-film with high productivity as compared to the related-art ruthenium compounds, a thin-film forming raw material containing the compound, and a method of producing a thin-film involving forming a thin-film containing a ruthenium atom through use of the raw material.

Solution to Problem

The inventors of the present invention made investigations, and as a result, found that a ruthenium compound including a ligand having a specific structure can solve the above-mentioned problem. Thus, the inventors reached the present invention.

In other words, according to embodiments of the present invention, there are provided a ruthenium compound represented by the following general formula (1) or (2) and a thin-film forming raw material containing the ruthenium compound:

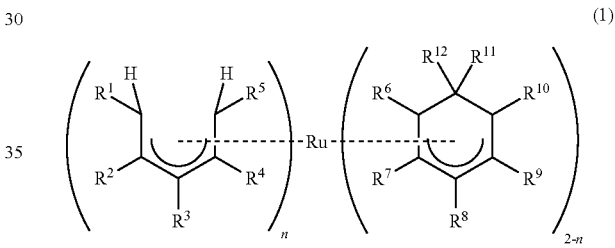

where $R^1$ to $R^{12}$ each independently represent a hydrogen atom, an alkyl group having 1 to 5 carbon atoms, or a fluorine atom-containing group, and "n" represents an integer from 0 to 2, provided that at least one of $R^1$ to $R^{12}$ represents the fluorine atom-containing group;

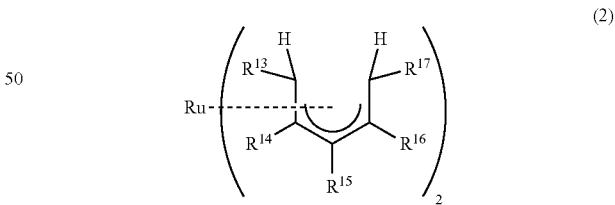

where $R^{13}$ to $R^{17}$ each independently represent a hydrogen atom or an alkyl group having 1 to 5 carbon atoms, and a total number of the carbon atoms of $R^{13}$ to $R^{17}$ is 3 or more.

In addition, according to one embodiment of the present invention, there is provided a method of producing a thin-film, including the steps of: vaporizing the thin-film forming raw material containing the ruthenium compound represented by the general formula (1) or (2); introducing vapor containing the ruthenium compound obtained in the vaporization step into a film formation chamber in which a substrate is set; and subjecting the ruthenium compound to decomposition and/or a chemical reaction, to thereby form the thin-film containing ruthenium atoms on a surface of the substrate.

Advantageous Effects of Invention

According to the present invention, the ruthenium compound having a low melting point, a large vapor pressure, and high thermal stability can be provided. In addition, the compound is suitable as a thin-film forming raw material to be used in the CVD method. In particular, the compound has an ALD window, and hence can be suitably used as a thin-film forming raw material to be used in an ALD method.

DESCRIPTION OF EMBODIMENTS

Figure 1:
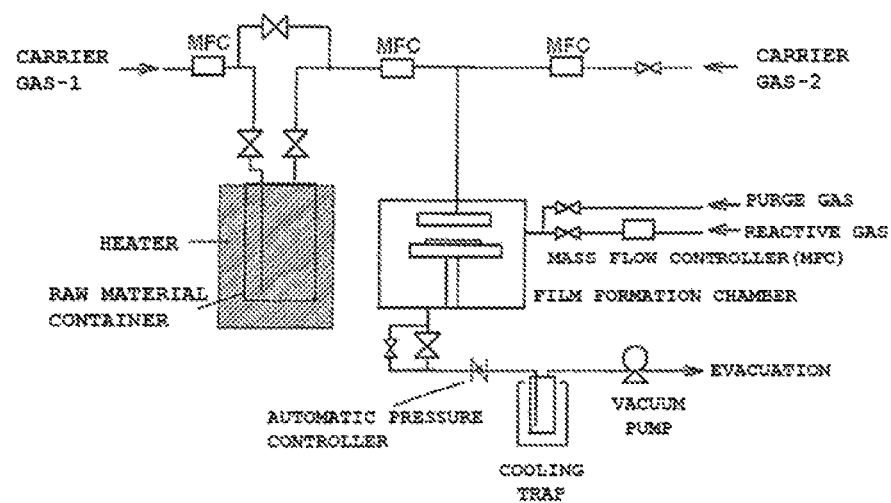
FIG. 1 is a schematic diagram for illustrating an example of an apparatus for chemical vapor deposition to be used in a method of producing a thin-film according to the present invention.

A ruthenium compound of the present invention is represented by the general formula (1) or (2), is suitable as a thin-film forming raw material to be used in a method of producing a thin-film including a vaporization step, such as a CVD method, and can also form a thin-film through use of an ALD method.

In the general formula (1) of the present invention, $R^1$ to $R^{12}$ each independently represent a hydrogen atom, an alkyl group having 1 to 5 carbon atoms, or a fluorine atom-containing group, and "n" represents an integer from 0 to 2, provided that at least one of $R^1$ to $R^{12}$ represents the fluorine atom-containing group. "n" represents preferably 0 or 2, more preferably 2.

Examples of the alkyl group having 1 to 5 carbon atoms represented by each of $R^1$ to $R^{12}$ include a methyl group, an ethyl group, a propyl group, an isopropyl group, a butyl group, an isobutyl group, a sec-butyl group, a tert-butyl group, a pentyl group, an isopentyl group, and a neopentyl group.

Examples of the fluorine atom-containing group include a fluoro group, a monofluoromethyl group, a difluoromethyl group, a trifluoromethyl group, and a trifluoroethyl group.

In addition, when the fluorine atom-containing group contains a carbon atom, the fluorine atom-containing group is preferably a fluoroalkyl group having 1 to 3 carbon atoms, more preferably a fluoroalkyl group having 1 or 2 carbon atoms, still more preferably a fluoroalkyl group having 1 carbon atom.

In the general formula (1), $R^1$ to $R^{12}$ are appropriately selected in accordance with a method of producing a thin-film to which the thin-film forming raw material is applied.

When the raw material is used in a method of producing a thin-film including a step of vaporizing the compound, it is preferred to select $R^1$ to $R^{12}$ so that the compound has a large vapor pressure, a low melting point, and high thermal stability.

Specifically, it is preferred that $R^1$ to $R^{12}$ be each independently selected from a hydrogen atom, an alkyl group having 1 to 3 carbon atoms, or a fluorine atom-containing group because the compound has a large vapor pressure. As the alkyl group having 1 to 3 carbon atoms, a methyl group or an ethyl group is preferred, and a methyl group is more preferred. As the fluorine atom-containing group, a fluorine atom, a monofluoromethyl group, a difluoromethyl group, or a trifluoromethyl group is preferred, and a trifluoromethyl group is more preferred. In addition, it is preferred that $R^1$ to $R^{12}$ contain one to three fluorine atom-containing groups similarly because the compound has a large vapor pressure. Meanwhile, from the viewpoint of thermal stability, it is preferred that $R^1$ to $R^{12}$ contain at least one alkyl group having 1 to 5 carbon atoms, and it is more preferred that. $R^1$ to $R^{12}$ contain one to three alkyl groups each having 1 to 5 carbon atoms.

In addition, in the case of a method of producing a thin-film by a MOD method free of any vaporization step, $R^1$ to $R^{12}$ may be arbitrarily selected in accordance with, for example, solubility in a solvent to be used and a thin-film formation reaction.

In addition, when "n" represents 2, $R^1$ to $R^5$ contain preferably one or two methyl groups or ethyl groups, more preferably one or two methyl groups.

In addition, when "n" represents 2, $R^1$ to $R^5$ contain preferably one or two fluorine atom-containing groups, more preferably one or two trifluoromethyl groups.

More specifically, when "n" represents 2, $R^1$ to $R^5$ contain preferably one methyl group or ethyl group, one trifluoromethyl group, and three hydrogen atoms, more preferably one methyl group, one trifluoromethyl group, and three hydrogen atoms. In this case, it is preferred that $R^1$ or $R^2$ represent a methyl group, and $R^4$ or $R^5$ represent a trifluoromethyl group, and it is more preferred that $R^2$ represent a methyl group, $R^4$ represent a trifluoromethyl group, and $R^1$, $R^3$, and $R^5$ each represent a hydrogen atom.

Preferred specific examples of the ruthenium compound represented by the general formula (1) include Compounds No. 1 to No. 96 below. In Compounds No. 1 to No. 96 below, "Me" represents a methyl group, "Et" represents an ethyl group, "iPr" represents an isopropyl group, and "tBu" represents a tert-butyl group.

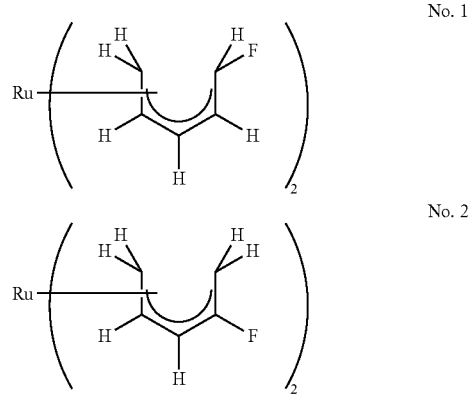

No. 3
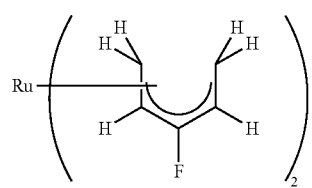
No. 4
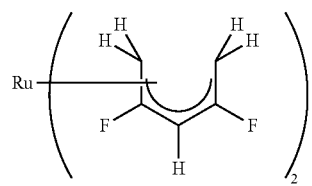
No. 5
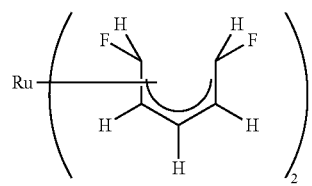
No. 6
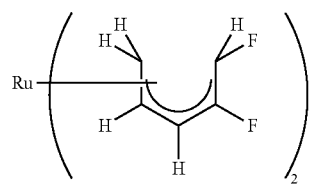
No. 7
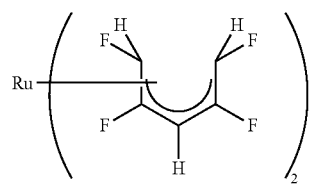
No. 8
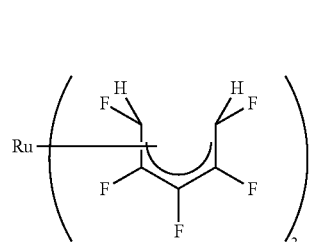
No. 9
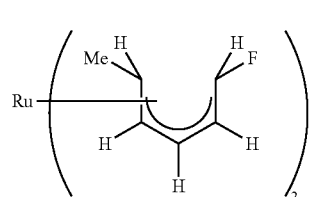
No. 10
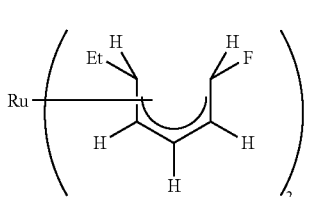
No. 11
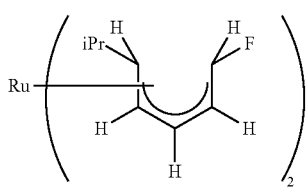
No. 12
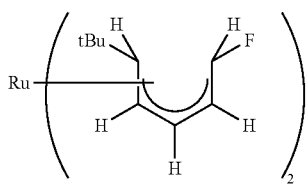
No. 13
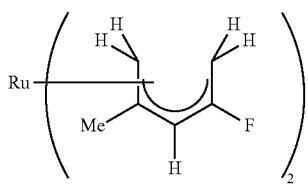
No. 14
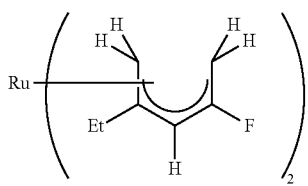
No. 15
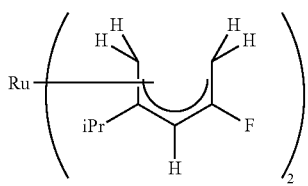
No. 16
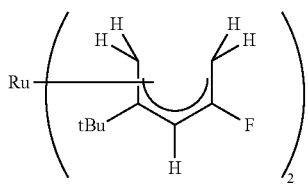
No. 17
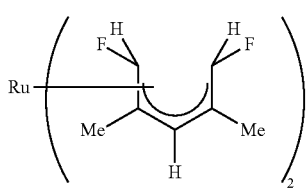
No. 18
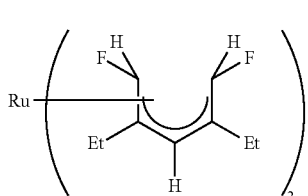

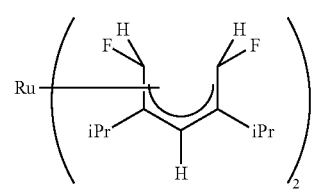 No. 19
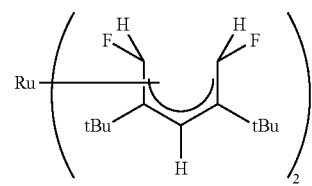 No. 20
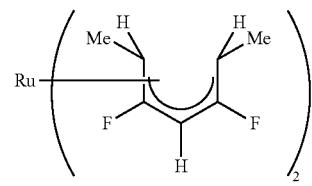 No. 21
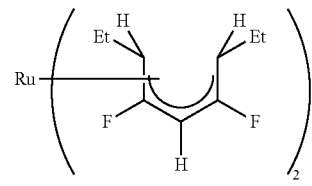 No. 22
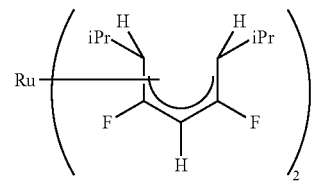 No. 23
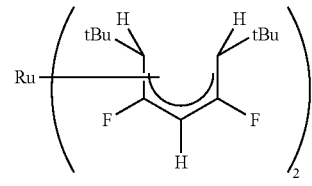 No. 24
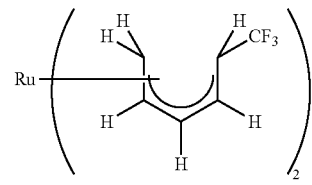 No. 25
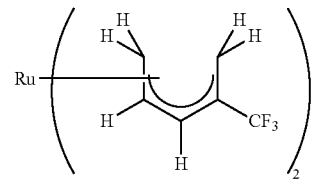 No. 26
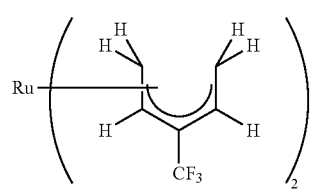 No. 27
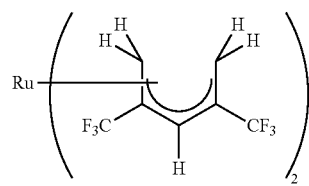 No. 28
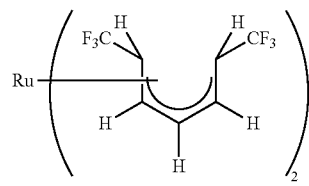 No. 29
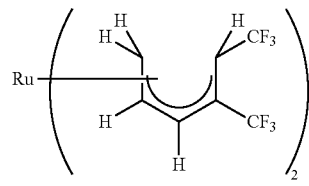 No. 30
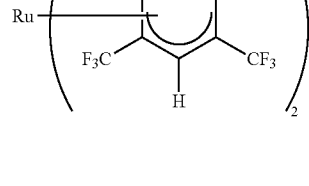 No. 31
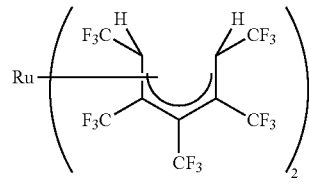 No. 32
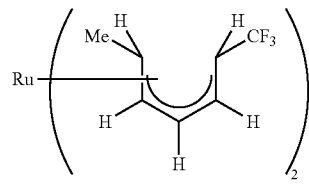 No. 33
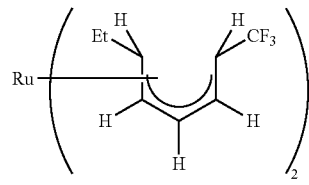 No. 34

No. 35
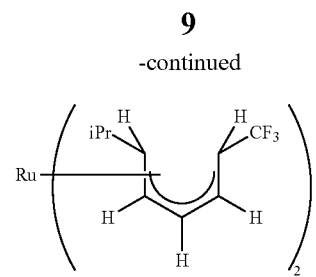
No. 36
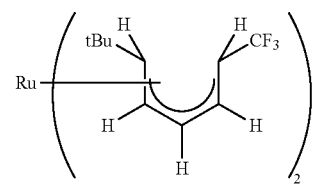
No. 37
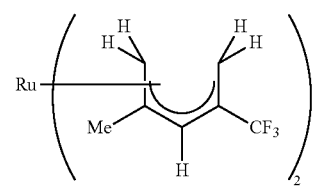
No. 38
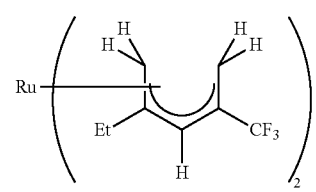
No. 39
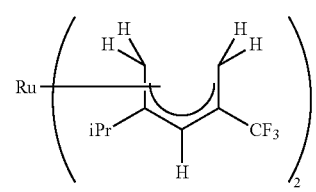
No. 40
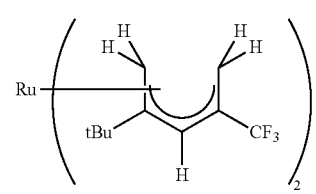
No. 41
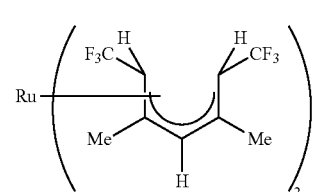
No. 42
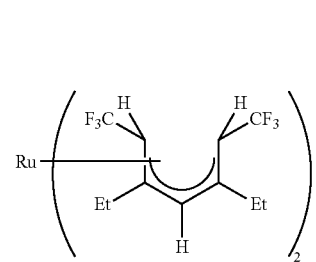
No. 43
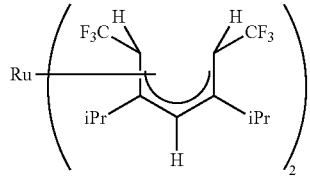
No. 44
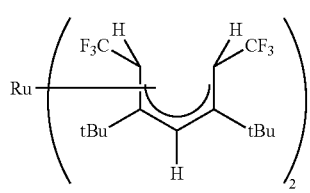
No. 45
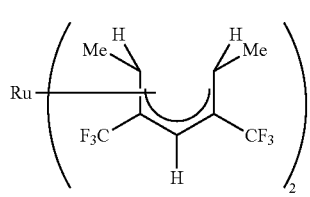
No. 46
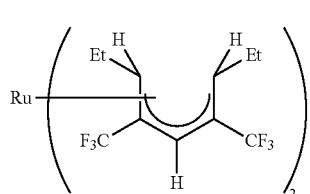
No. 47
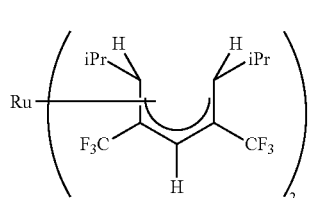
No. 48
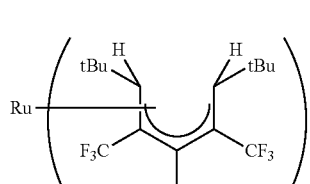
No. 49
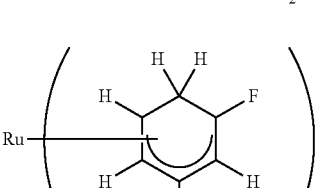
No. 50
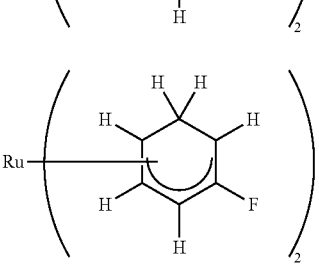

-continued
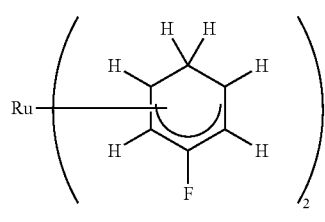 No. 51
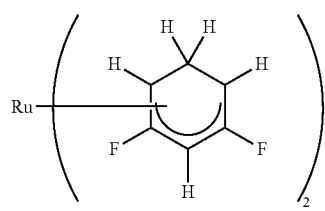 No. 52
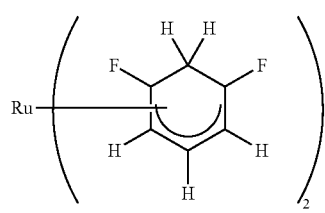 No. 53
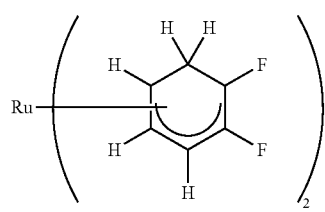 No. 54
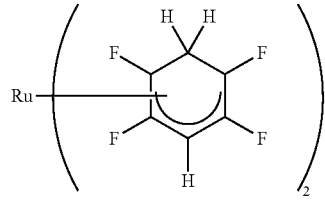 No. 55
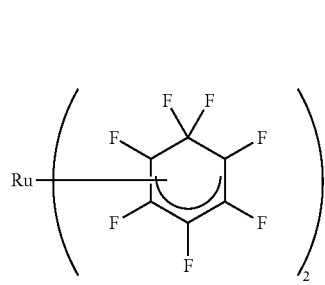 No. 56
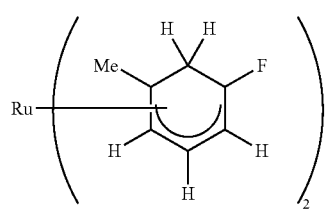 No. 57
-continued
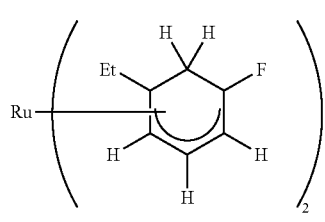 No. 58
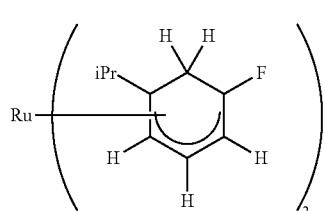 No. 59
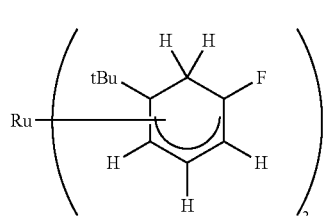 No. 60
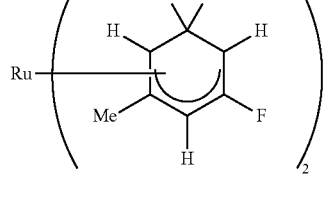 No. 61
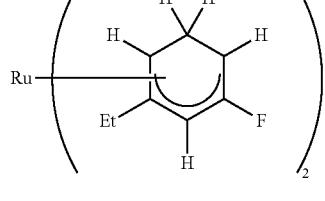 No. 62
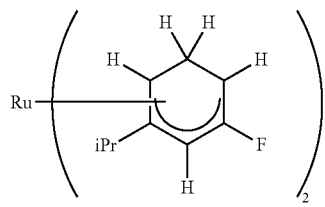 No. 63
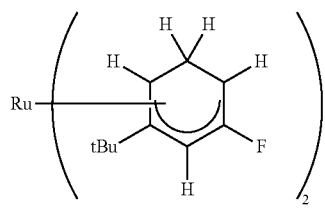 No. 64

-continued
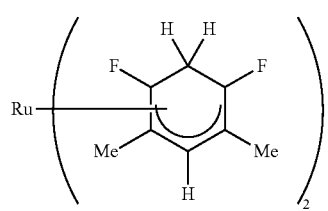
No. 65
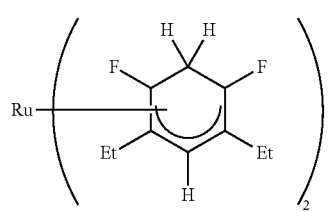
No. 66
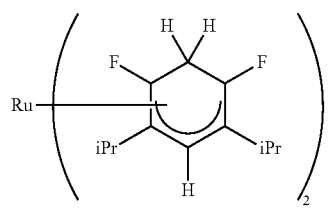
No. 67
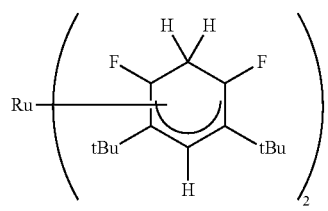
No. 68
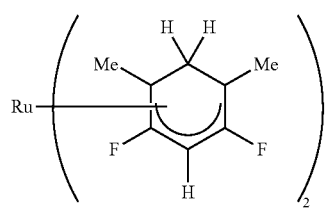
No. 69
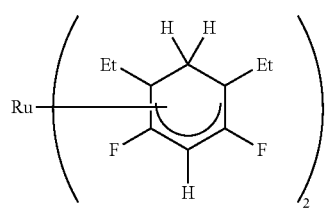
No. 70
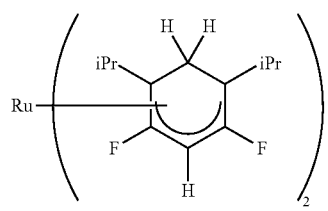
No. 71
-continued
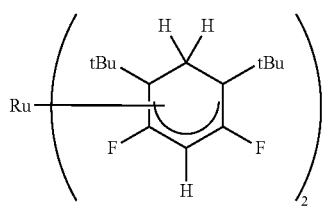
No. 72
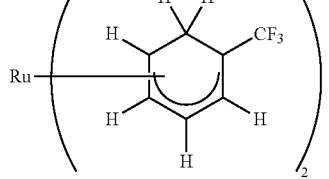
No. 73
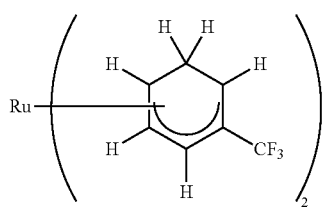
No. 74
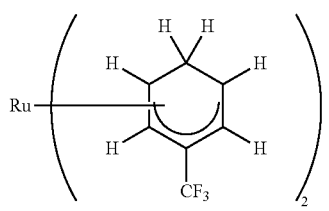
No. 75
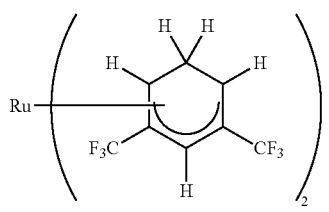
No. 76
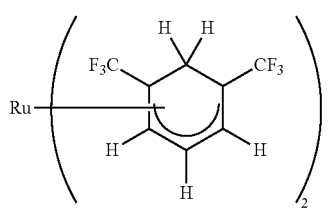
No. 77
No. 78

-continued
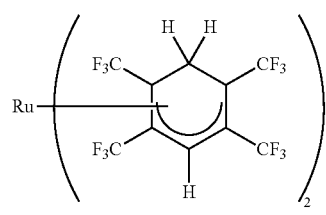
No. 79
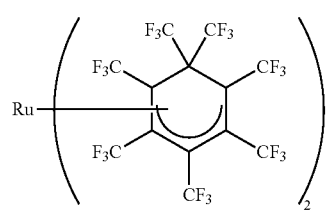
No. 80
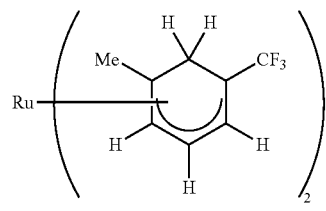
No. 81
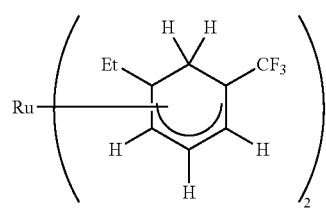
No. 82
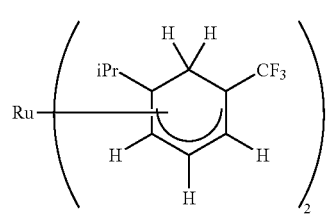
No. 83
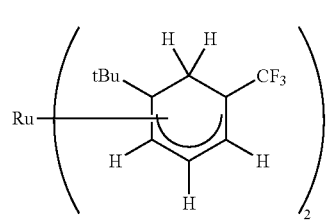
No. 84
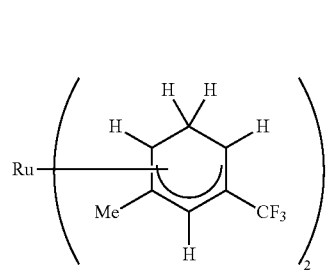
No. 85
-continued
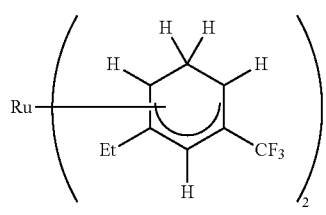
No. 86
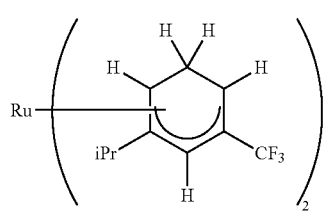
No. 87
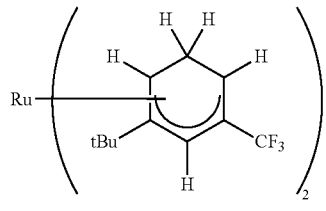
No. 88
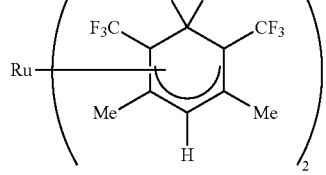
No. 89
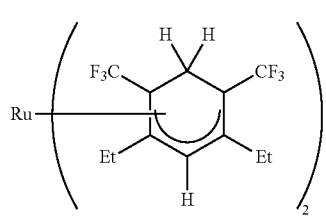
No. 90
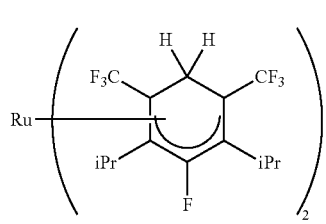
No. 91
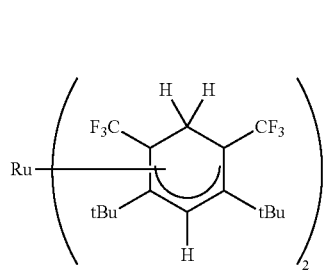
No. 92

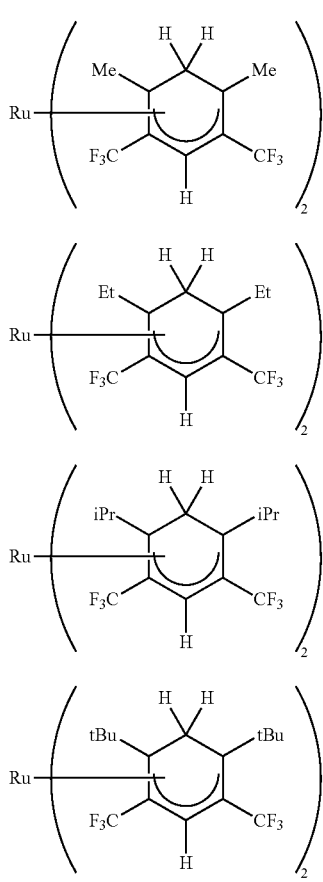

A method of producing the compound represented by the general formula (1) is not particularly limited, and the compound is produced by applying a well-known reaction. The compound may be obtained by, for example, a production method including: causing dichlorodi-µ-chlorobis[(1,2,3,6,7,8-η-2,7-alkyl-2,6-octadiene)-1,8-diyl]dirutheniun (IV), lithium carbonate, acetonitrile, and a fluorine-based diene compound having a corresponding structure to react with each other under an alcohol solvent; then removing the solvent to obtain an intermediate; adding dichloromethane to the obtained intermediate, followed by filtration; distilling off the solvent from the filtrate; and then purifying the resultant through distillation.

Examples of the fluorine-based diene compound include 1-fluoropenta-1,3-diene, 2-fluoropenta-1,3-diene, 3-fluoropenta-1,3-diene, 2,4-difluoropenta-1,3-diene, 1,5-difluoropenta-1,3-diene, 1,2-difluoropenta-1,3-diene, 1,2,4,5-tetrafluoropenta-1,3-diene, 1,2,3,4,5-pentafluoropenta-1,3-diene, 1-fluorohexa-2,4-diene, 1-fluorohepta-2,4-diene, 4-fluoro-2-methylpenta-1,3-diene, 2-fluoro-4-methylenehex-2-ene, 1,5-difluoro-2,4-dimethylpenta-1,3-diene, 3,5-difluorohepta-2,4-diene, 6,6,6-trifluorohexa-1,3-diene, 5,5,5-trifluoro-4-methylpenta-1,3-diene, 3-(trifluoromethyl)penta-1,3-diene, 5,5,5-trifluoro-4-methyl-2-(trifluoromethyl)penta-1,3-diene, 1,1,1,7,7,7-hexafluoropenta-2,4-diene, 6,6,6-trifluoro-4-(trifluoromethyl)hexa-1,3-diene, 1,1,1,7,7,7-hexafluoro-3,5-bis(trifluoromethyl)hepta-2,4-diene, 1,1,1,7,7,7-hexafluoro-3,4,5-tris (trifluoromethyl)hepta-2,4-diene, 7,7,7-trifluorohepta-2,4-diene, 1,1,1-trifluoroocta-3,5-diene, 4-methyl-2-(trifluoromethyl)penta-1,3-diene, 1,1,1-trifluoro-2-methyl-4-methylhex-2-ene, 1,1,1,7,7,7-hexafluoro-3,5-dimethylhepta-2,4-diene, and 3,5-bis(trifluoromethyl)hepta-2,4-diene. In addition, 5 mol to 10 mol of the fluorine-based diene compound is added to 1 mol of dichlorodi-µ-chlorobis[(1,2,3,6,7,3-η-2,7-alkyl-2,6-octadiene)-1,8-diyl]diruthenium(IV).

In the general formula (2) of the present invention, $R^{13}$ to $R^{17}$ each independently represent a hydrogen atom or an alkyl group having 1 to 5 carbon atoms, and the total number of the carbon atoms of $R^{13}$ to $R^{17}$ is 3 or more. In addition, the total number of the carbon atoms of $R^{13}$ to $R^{17}$ is preferably 10 or less, more preferably 6 or less, still more preferably 4 or less.

Examples of the alkyl group having 1 to 5 carbon atoms represented by each of $R^{13}$ to $R^{17}$ include a methyl group, an ethyl group, a propyl group, an isopropyl group, a butyl group, an isobutyl group, a sec-butyl group, a tert-butyl group, a pentyl group, an isopentyl group, and a neopentyl group.

In the general formula (2), $R^{13}$ to $R^{17}$ are appropriately selected in accordance with a method of producing a thin-film to which the thin-film forming raw material is applied. When the raw material is used in a method of producing a thin-film including a step of vaporizing the compound, it is preferred to select $R^{13}$ to $R^{17}$ so that the compound has a large vapor pressure, a low melting point, and high thermal stability.

Specifically, it is preferred that $R^{13}$ to $R^{17}$ be each independently selected from a hydrogen atom and an alkyl group having 1 to 3 carbon atoms, it is more preferred that $R^{13}$ to $R^{17}$ be selected from a hydrogen atom, a methyl group, and an ethyl group, and it is still more preferred that $R^{13}$ to $R^{17}$ each represent a methyl group, because the compound has a large vapor pressure. In addition, the total number of the carbon atoms of $R^{13}$ to $R^{17}$ is preferably from 3 to 10, more preferably from 3 to 6, still more preferably 3 or 4, yet still more preferably 3 because the compound has a large vapor pressure. It is preferred that $R^1$ and $R^{17}$ represent groups different from each other, and/or that $R^{14}$ and $R^{16}$ represent groups different from each other because the compound has a low melting point. Meanwhile, from the viewpoint of the thermal stability of the compound, it is preferred that $R^{13}$ to $R^{17}$ contain three or more alkyl groups each having 1 to 5 carbon atoms.

In addition, in the case of a method of producing a thin-film by a MOD method free of any vaporization step, $R^{13}$ to $R^{17}$ may be arbitrarily selected in accordance with, for example, solubility in a solvent to be used and a thin-film formation reaction.

As one embodiment of the ruthenium compound represented by the general formula (2), when the total number of the carbon atoms of $R^{13}$ to $R^{17}$ is 3, it is preferred that $R^{13}$ to $R^{17}$ contain three methyl groups, and it is preferred that $R^{14}$, $R^{16}$, and $R^{17}$ each represent a methyl group.

Preferred specific examples of the ruthenium compound represented by the general formula (2) include Compounds No. 97 to No. 117 below. In Compounds No. 97 to No. 117 below, "Me" represents a methyl group, "Et" represents an ethyl group, "iPr" represents an isopropyl group, and "tBu" represents a tert-butyl group.

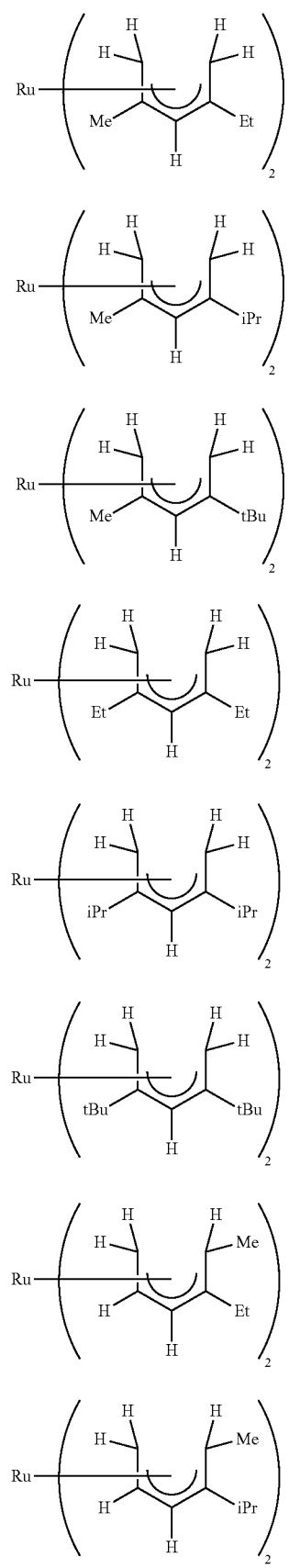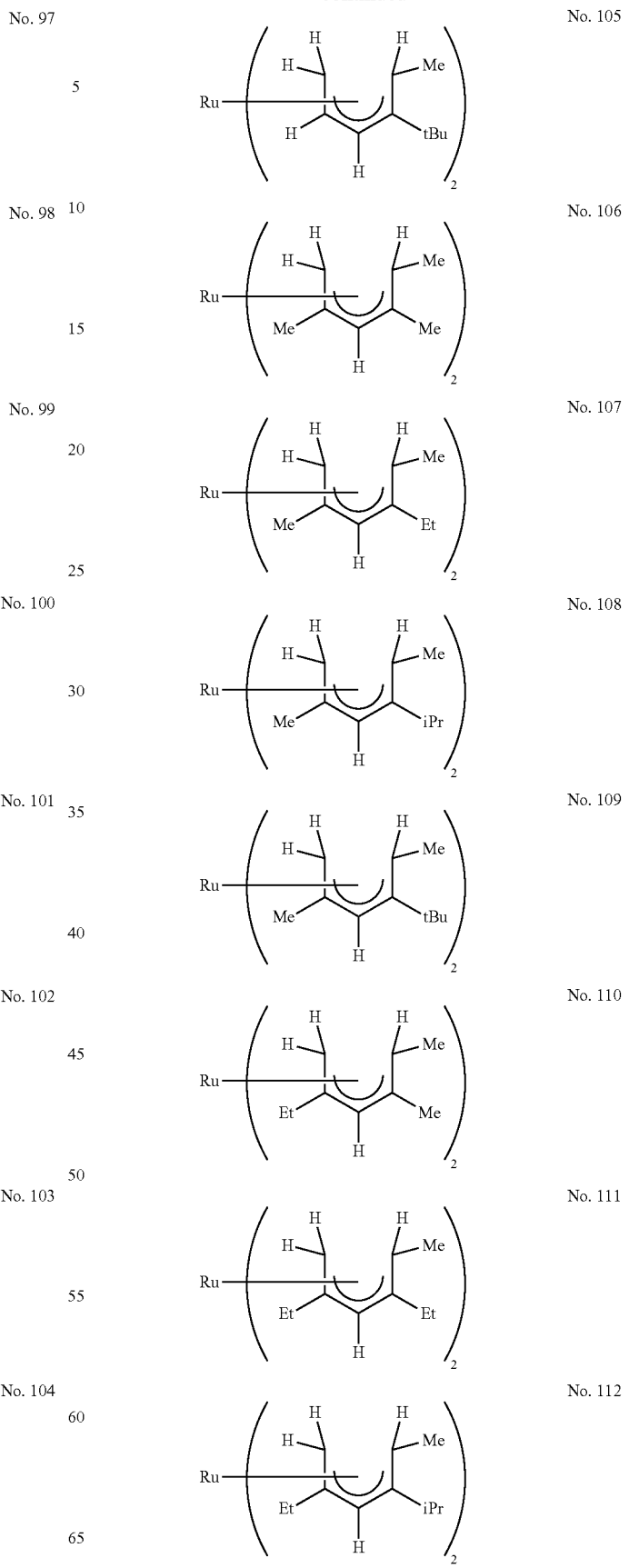

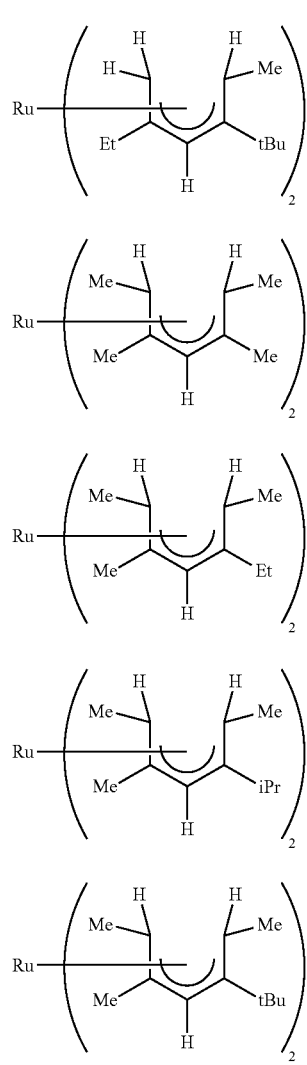

No. 113
No. 114
No. 115
No. 116
No. 117

A method of producing the Compound represented by the general formula (2) is not particularly limited, and the compound is produced by applying a well-known reaction. The compound may be obtained by, for example, a production method including: causing dichlorodi-μ-chlorobis[(1, 2, 3, 6,7, 8-η-2,7-alkyl-2,6-octadiene)-1,8-diyl]dirutheniun (IV), lithium carbonate, acetonitrile, and a diene compound having a corresponding structure to react with each other under an alcohol solvent; then removing the solvent to obtain an intermediate; adding dichloromethane to the obtained intermediate, followed by filtration; distilling off the solvent from the filtrate; and purifying the resultant through distillation.

Examples of the diene compound include 2-methyl-4-methylenehex-2-ene and 2,4-dimethylhexa-1,3-diene. In addition, 5 mol to 10 mol of the fluorine-based diene compound is added to 1 mol of dichlorodi-μ-chlorobis[(1,2, 3,6,7,8-η-2,7-alkyl-2,6-octadiene)-1,8-diyl]diruthenium (IV).

Next, the thin-film forming raw material of the present invention includes the ruthenium compound of the present invention described above as a precursor of a thin-film. The form of the thin-film forming raw material varies depending on a production process to which the thin-film forming raw material is applied. For example, when a thin-film containing only ruthenium as a metal is produced, the thin-film forming raw material of the present invention is free of a metal compound other than the ruthenium compound of the present invention and a Semimetal compound. Meanwhile, when a thin-film containing two or more kinds of metals and/or a semimetal is produced, the thin-film forming raw material of the present invention may include a compound containing a desired metal and/or a compound containing the semimetal (hereinafter sometimes referred to as "other precursor") in addition to the ruthenium compound of the present invention. The thin-film forming raw material of the present invention may further contain an organic solvent and/or a nucleophilic reagent as described later. As described above, the physical properties of the ruthenium compound of the present invention serving as the precursor are suitable for a CVD method and an ALD method, and hence the thin-film forming raw material of the present invention is useful, in particular, as a chemical vapor deposition raw material (hereinafter sometimes referred to as "CVE) raw material").

When the thin-film forming raw material of the present invention is a chemical vapor deposition raw material, the form thereof is appropriately selected depending on a procedure, such as a transportation and supply method of the CVD method to be used.

As the above-mentioned transportation and supply method, there are given a gas transportation method and a liquid transportation method. The gas transportation method involves heating and/or decompressing the CVD raw material in a container in which the raw material is stored (hereinafter sometimes referred to as "raw material container"), to thereby vaporize the raw material to obtain vapor, and introducing the vapor into a film formation chamber (hereinafter sometimes referred to as "deposition reaction portion") having a substrate set therein together with a carrier gas, such as argon, nitrogen, or helium, to be used as required. The liquid transportation method involves transporting the CVD raw material to a vaporization chamber under the state of a liquid or a solution, heating and/or decompressing the raw material in the vaporization chamber, to thereby vaporize the raw material to obtain vapor, and introducing the vapor into the film formation chamber. In the case of the gas transportation method, the ruthenium compound represented by the general formula (1) or (2) itself may be used as the CVD raw material. In the case of the liquid transportation method, the ruthenium compound represented by the general formula (1) or (2) itself or a solution obtained by dissolving the compound in an organic solvent may be used as the CVD raw material. Any such CVD raw material may further contain the other precursor, a nucleophilic reagent, and the like.

In addition, in a multi-component CVD method, there are given a method involving vaporizing and supplying the CVD raw material independently for each component (hereinafter sometimes referred to as "single source method"), and a method involving vaporizing and supplying a mixed raw material obtained by mixing a multi-component raw material with a desired composition in advance (hereinafter sometimes referred to as "cocktail source method"). In the case of the cocktail source method, a mixture of the ruthenium compound of the present invention and the other precursor or a mixed solution obtained by dissolving the mixture in an organic solvent may be used as the CVD raw material. The mixture or the mixed solution may further contain a nucleophilic reagent and the like.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixed solvent thereof depending on the solubility of a solute, the relationship among the use temperature, the boiling point, and the flash point, and the like. The amount of the entire precursors in the CVD raw material (solution state) obtained by dissolving the precursors in the organic solvent is typically from 0.01 mol/liter to 2.0 mol/liter, preferably from 0.05 mol/liter to 1.0 mol/liter. When the thin-film forming raw material of the present invention is free of a metal compound other than the ruthenium compound of the present invention and a semimetal compound, the amount of the entire precursors refers to the amount of the ruthenium compound of the present invention. When the thin-film forming raw material of the present invention includes a compound containing another metal and/or a compound containing a semimetal in addition to the ruthenium compound, the amount of the entire precursors refers to the total amount of the ruthenium compound of the present invention and the other precursor.

In addition, in the case of the multi-component CVD method, there is no particular limitation on the other precursor to be used together with the ruthenium compound of the present invention, and a well-known general precursor used in the CVD raw material may be used.

Examples of the other precursor include compounds of one kind or more kinds selected from the group consisting of compounds used as organic ligands, such as an alcohol compound, a glycol compound, a β-diketone compound, a cyclopentadiene compound, and an organic amine compound, and silicon or a metal. In addition, examples of the kind of the metal in the precursor include lithium, sodium, potassium, magnesium, calcium, strontium, barium, titanium, zirconium, hafnium, vanadium, tantalum, chromium, molybdenum, tungsten, manganese, iron, cobalt, rhodium, iridium, nickel, palladium, platinum, copper, silver, gold, zinc, aluminum, gallium, indium, germanium, tin, lead, antimony, bismuth, yttrium, lanthanum, cerium, praseodymium, neodymium, promethium, samarium, europium, gadolinium, terbium, dysprosium, holmium, erbium, thulium, ytterbium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethyiamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

In addition, examples of the β-diketone compound include: alkyl-substituted-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy)heptane-3,5-dione.

In addition, examples of the cyclopentadiene compound include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene, and examples of the organic amine compound to be used as the above-mentioned organic ligand include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. An example of the production methods is given as described below. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal, and examples of the alkali metal alkoxide may include a sodium alkoxide, a lithium alkoxide, and a potassium alkoxide.

In the case of the single source method, a compound similar to the ruthenium compound of the present invention in the behavior of thermal decomposition and/or oxidative decomposition is preferably used as the above-mentioned other precursor. In the case of the cocktail source method, a compound that not only is similar to the ruthenium compound of the present invention in the behavior of thermal decomposition and/or oxidative decomposition but also does not cause any change impairing desired characteristics as a precursor through a chemical reaction or the like at the time of mixing is preferably used as the above-mentioned other precursor.

In addition, the thin-film forming raw material of the present invention may contain a nucleophilic reagent as required in order to impart stability to the ruthenium compound of the present invention and the other precursor. Examples of the nucleophilic reagent include: ethylene glycol ethers, such as glyme, diglyme, triglyme, and tetraglyme; crown ethers, such as 18-crown-6, dicyclohexyl-18-crown-6, 24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The usage amount of each of those nucleophilic reagents is preferably from 0.1 mol to 10 mol, more preferably from 1 mol to 4 mol with respect to 1 mol of the amount of the entire precursors.

The thin-film forming raw material of the present invention is prevented from containing impurity metal elements other than the components forming the raw material, impurity halogens, such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, most preferably 1 ppm or less. The total content of the impurity organic substances is preferably 500 ppm or less, more preferably 50 ppm or less, most preferably 10 ppm or less. In addition, moisture causes generation of particles in the chemical vapor deposition raw material and generation of particles during thin-film formation. Accordingly, moisture in each of the precursor, the organic solvent, and the nucleophilic reagent is preferably removed as much as possible before its use. The moisture content of each of the precursor, the organic solvent, and the nucleophilic reagent is preferably 10 ppm or less, more preferably 1 ppm or less.

In addition, it is preferred that the thin-film forming raw material of the present invention be prevented from containing particles to the extent possible in order to reduce or prevent particle contamination of a thin-film to be formed. Specifically, in particle measurement with a light scattering liquid particle detector in a liquid phase, it is preferred that the number of particles larger than 0.3 μm be 100 or less in 1 mL of the liquid phase, it is more preferred that the number of particles larger than 0.2 μm be 1,000 or less in 1 mL of the liquid phase, and it is most preferred that the number of particles larger than 0.2 μm be 100 or less in 1 mL of the liquid phase.

A method of producing a thin-film of the present invention in which the thin-film is produced by using the thin-film forming raw material of the present invention is a CVD method including: introducing vapor obtained by vaporizing the thin-film forming raw material of the present invention and a reactive gas to be used as required into a film formation chamber (treatment atmosphere) having a substrate set therein; and then subjecting the precursor to decomposition and/or a chemical reaction on the substrate, to thereby grow and deposit the thin-film containing a metal on the surface of the substrate. There are no particular limitations on a transportation and supply method for the raw material, a deposition method therefor, production conditions, a production apparatus, and the like, and well-known general conditions and methods may be used.

Examples of the above-mentioned reactive gas to be used as required include: oxidizing gases, such as oxygen, ozone, nitrogen dioxide, nitrogen monoxide, water vapor, hydrogen peroxide, formic acid, acetic acid, and acetic anhydride; reducing gases, such as hydrocarbon compounds including methane and ethane, hydrogen, carbon monoxide, and organic metal compounds; and gases for producing nitrides, such as organic amine compounds including a monoalkylamine, a dialkylamine, a trialkylamine, and an alkylenediamine, hydrazine, and ammonia. Those gases may be used alone or in combination thereof. The thin-film forming raw material of the present invention has satisfactory reactivity with a reducing gas out of those gases, and has particularly satisfactory reactivity with hydrogen. Accordingly, when one kind is used as the reactive gas, hydrogen is preferably used, and when a mixed gas of two or more kinds is used as the reactive gas, the mixed gas preferably contains at least hydrogen.

In addition, examples of the above-mentioned transportation and supply method include the gas transportation method, the liquid transportation method, the single source method, and the cocktail source method described above.

In addition, examples of the above-mentioned deposition method include: thermal CVD including causing a raw material gas, or the raw material gas and a reactive gas, to react only with heat, to thereby deposit a thin-film; plasma CVD using heat and plasma; optical CVD using heat and light; optical plasma CVD using heat, light, and plasma; and ALD including dividing a deposition reaction of CVD into elementary steps, and performing deposition at a molecular level in a stepwise manner.

As a material for the substrate, there are given, for example: silicon; ceramics, such as silicon nitride, titanium nitride, tantalum nitride, titanium oxide, titanium nitride, ruthenium oxide, zirconium oxide, hafnium oxide, and lanthanum oxide; glass; and metals, such as metal cobalt. The shape of the substrate is, for example, a plate shape, a spherical shape, a fibrous shape, or a scaly shape. The surface of the substrate may be planar, or may have a three-dimensional structure, such as a trench structure.

In addition, examples of conditions for the above-mentioned production method include a reaction temperature (substrate temperature), a reaction pressure, and a deposition rate. The reaction temperature is preferably not less than 100° C. that is the temperature at which the compound of the present invention sufficiently reacts, more preferably from 150° C. to 400° C., particularly preferably from 200° C. to 350° C. In addition, the reaction pressure is preferably from 10 Pa to an atmospheric pressure in the case of the thermal CVD or the optical CVD, and is preferably from 10 Pa to 2,000 Pa in the case of using plasma.

In addition, the deposition rate may be controlled by the supply conditions (vaporization temperature and vaporization pressure) of the raw material, the reaction temperature, and the reaction pressure. When the deposition rate is large, the characteristics of a thin-film to be obtained may deteriorate. When the deposition rate is small, a problem may occur in productivity. Accordingly, the deposition rate is preferably from 0.01 nm/min to 100 nm/min, more preferably from 1 nm/min to 50 nm/min. In addition, in the case of the ALD method, the deposition rate is controlled by the number of cycles so that a desired film thickness may be obtained.

As conditions for the above-mentioned production method, there are further given a temperature and a pressure when the thin-film forming raw material is vaporized to obtain vapor. The step of vaporizing the thin-film forming raw material to obtain vapor may be performed in the raw material container or in the vaporization chamber. In any case, it is preferred that the thin-film forming raw material of the present invention be evaporated at a temperature of from 0° C. to 150° C. In addition, when the thin-film forming raw material is vaporized to obtain vapor in the raw material container or in the vaporization chamber, the pressure in the raw material container and the pressure in the vaporization chamber are both preferably from 1 Pa to 10,000 Pa.

When the ALD method is adopted, the method of producing a thin-film of the present invention may include, in addition to a raw material introduction step of vaporizing the thin-film forming raw material by the above-mentioned transportation and supply method to provide vapor, followed by the introduction of the vapor into the film formation chamber, a precursor thin-film formation step of forming a precursor thin-film from the above-mentioned compound in the vapor on the surface of the above-mentioned substrate, an evacuation step of evacuating an unreacted compound gas, and a metal-containing thin-film formation step of causing the precursor thin-film to chemically react with the reactive gas, to thereby form a thin-film containing a metal on the surface of the substrate.

Now, regarding each step of the ALD method, the case of forming a metal thin-film is described in detail as an example. First, the above-mentioned raw material introduction step is performed. The preferred temperature and pressure when the thin-film forming raw material is turned into vapor are the same as those described in the method of producing a thin-film by the CVD method. Next, the vapor introduced intro the film formation chamber and the surface of the substrate are brought into contact with each other, and hence the precursor thin-film is formed on the surface of the substrate (precursor thin-film formation step). In this case, heat may be applied by heating the substrate or heating the film formation chamber. The precursor thin-film formed in this step is a thin-film produced from the compound of the present invention or a thin-film produced by the decomposition and/or reaction of part of the compound of the present invention, and hence has composition different from that of the target metal nitride thin-film. The temperature of the substrate when this step is performed is preferably from room temperature to 500° C., more preferably from 150° C. to 350° C. The pressure of a system (in the film formation chamber) when this step is performed is preferably from 1 Pa to 10,000 Pa, more preferably from 10 Pa to 1,000 Pa.

Next, the unreacted compound gas and a gas generated as a by-product are evacuated from the film formation chamber (evacuation step). It is ideal that the unreacted compound gas and the gas generated as a by-product be completely evacuated from the film formation chamber, but it is not always required that the gases be completely evacuated. As an evacuation method, there are given, for example: a method including purging the inside of the system with an inert gas, such as nitrogen, helium, or argon; a method including performing evacuation by decompressing the inside of the system; and a combination of these methods. The degree of decompression when the decompression is performed is preferably from 0.01 Pa to 300 Pa, more preferably from 0.01 Pa to 100 Pa.

Next, a reducing gas is introduced as the reactive gas into the film formation chamber, and the metal thin-film is formed from the precursor thin-film obtained in the previous precursor thin-film formation step through the action of the reducing gas or the action of the reducing gas and heat (metal-containing thin-film formation step). In this step, the temperature when the heat is applied is preferably from room temperature to 500° C., more preferably from 150° C. to 350° C. The pressure of the system (in the film formation chamber) when this step is performed is preferably from 1 Pa to 10,000 Pa, more preferably from 10 Pa to 1,000 Pa. The compound of the present invention has satisfactory reactivity with the reducing gas, and hence a high-quality metal thin-film containing less residual carbon can be obtained.

When the ALD method is adopted in the method of producing a thin-film of the present invention as described above, thin-film deposition performed by a series of operations including the above-mentioned raw material introduction step, precursor thin-film formation step, evacuation step, and metal-containing thin-film formation step is defined as one cycle, and this cycle may be repeated a plurality of times until a thin-film having a required film thickness is obtained. In this case, it is preferred that, after one cycle is performed, a compound gas and a reactive gas that are unreacted, and a gas generated as a by-product be evacuated from the deposition reaction portion in the same manner as in the above-mentioned evacuation step, and then the subsequent one cycle be performed.

In addition, in the formation of the metal thin-film by the ALD method, energy, such as plasma, light, or a voltage, may be applied, and a catalyst may be used. There are no particular limitations on the timing for applying the energy and the timing for using the catalyst. The energy may be applied or the catalyst may be used, for example, at the time of introducing the compound gas in the raw material introduction step, at the time of heating in the precursor thin-film formation step or the metal-containing thin-film formation step, at the time of evacuating the inside of the system in the evacuation step, or at the time of introducing the reducing gas in the metal-containing thin-film formation step, or between the above-mentioned respective steps.

In addition, in the method of producing a thin-film of the present invention, after the thin-film deposition, annealing treatment may be performed in an inert atmosphere, an oxidizing atmosphere, or a reducing atmosphere in order to obtain more satisfactory electrical characteristics. When step embedding is required, a reflow step may be provided. The temperature in this case is from 200° C. to 1,000° C., preferably from 250° C. to 500° C.

Figure 2:
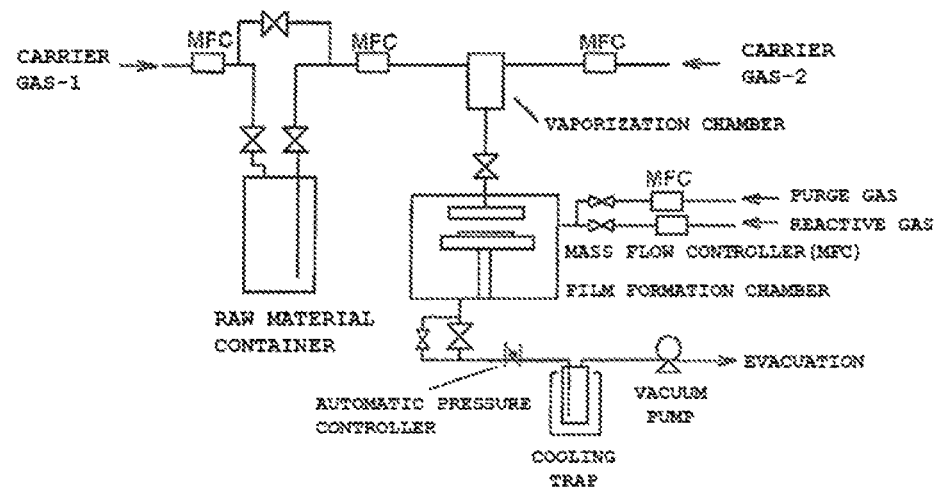
FIG. 2 is a schematic diagram for illustrating another example of the apparatus for chemical vapor deposition to be used in the method of producing a thin-film according to the present invention.
Figure 3:
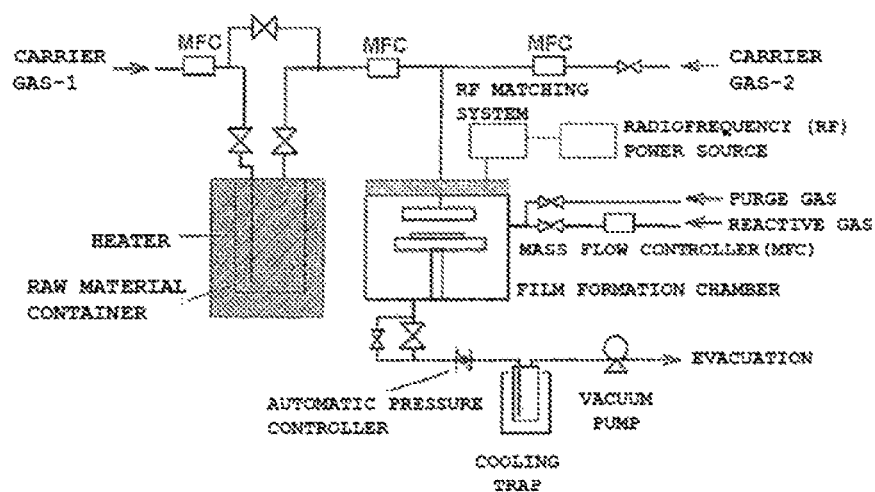
FIG. 3 is a schematic diagram for illustrating still another example of the apparatus for chemical vapor deposition to be used in the method of producing a thin-film according to the present invention.
Figure 4:
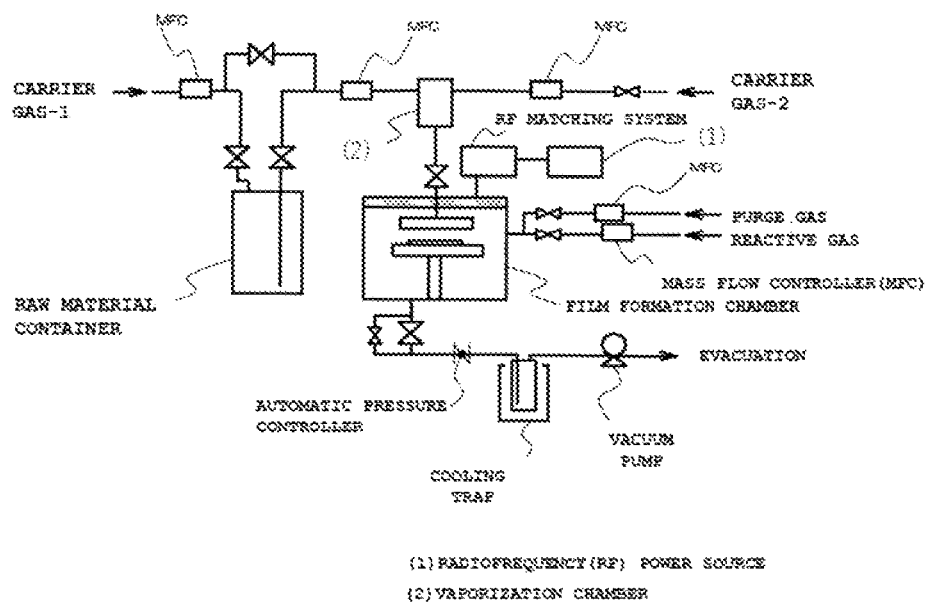
FIG. 4 is a schematic diagram for illustrating yet still another example of the apparatus for chemical vapor deposition to be used in the method of producing a thin-film according to the present invention.

As an apparatus for producing a thin-film through use of the thin-film forming raw material of the present invention, a well-known apparatus for a chemical vapor deposition method may be used. As specific examples of the apparatus, there are given an apparatus capable of performing bubbling supply of a precursor as illustrated in FIG. 1 and an apparatus including a vaporization chamber as illustrated in FIG. 2. In addition, there is given an apparatus capable of subjecting the reactive gas to plasma treatment as illustrated in FIG. 3 and FIG. 4. The apparatus is not limited to single-substrate type apparatus as illustrated in FIG. 1 to FIG. 4, and an apparatus capable of simultaneously processing a large number of substrates through use of a batch furnace may also be used.

A thin-film produced through use of the thin-film forming raw material of the present invention may be formed as desired kinds of thin-films, such as thin-films of a metal, oxide ceramics, nitride ceramics, and glass, by appropriately selecting the other precursor, the reactive gas, and the production conditions. It has been known that the thin-films exhibit electrical characteristics, optical characteristics, and the like, and the thin-films have been applied to various usages. Examples thereof include a metal ruthenium thin-film, a ruthenium oxide thin-film, a ruthenium nitride thin-film, a ruthenium alloy, and a ruthenium-containing composite oxide thin-film. Examples of the ruthenium alloy include a Ru—Pd alloy and a Ru—Pt alloy. Those thin-films have been widely used in the production of, for example, electrode materials for memory elements typified by DRAM elements, resistance films, diamagnetic films used for the recording layers of hard disks, and catalyst materials for polymer electrolyte fuel cells.

EXAMPLES

The present invention is described in more detail below by way of the Production Examples, the Evaluation Examples, the Examples, and the Comparative Examples. However, the present invention is by no means limited by Examples and the like below.

[Production Example 1] Synthesis of Compound No. 37

Under an Ar atmosphere, 10 g of dichlorodi-μ-chlorobis [(1, 2, 3, 6, 7, 8-η-2,7-dimethyl-2,6-octadiene)-1,8-diyl] diruthenium(IV) and 19 g of lithium carbonate were added to a 1 L four-necked flask. Then, 405 ml of ethanol, 19 g of 4-methyl-2-(trifluoromethyl)penta-1,3-diene, and 0.7 g of acetonitrile were added to the mixture. The reaction solution was heated and stirred at 90° C. for 5 hours. After the heating and stirring, the solvent was distilled off from the reaction solution in an oil bath at 90° C. under reduced pressure, and 200 ml of dichloromethane was added to the obtained residue, followed by filtration. After the filtration, the solvent was distilled off from the filtrate in an oil bath at 55° C. under normal pressure. After the removal of the solvent, distillation was performed in an oil bath at 0.105° C. and 15 Pa to obtain Compound No. 37 as a pale yellow crystal (yield: 2.44 g, percent yield: 18.8%).
(Analytic Values)
(1) Normal-Pressure TG-DTA
50% mass loss temperature: 180° C. (760 Torr, Ar flow rate: 100 ml/min, temperature increase rate: 10° C./min)
(2) Reduced-Pressure TG-DTA
50% mass loss temperature: 105° C. (10 Torr, Ar flow rate: 50 ml/min, temperature increase rate: 10° C./min)
(3) $^1$H-NMR (Deuterated Benzene)
0.138 ppm (1H, multiplet), 0.415-0.443 ppm (H, multiplet), 1.418-1.437 ppm (3H, doublet), 1.595-1.624 ppm (6H, multiplet), 2.523-2.862 ppm (2H, multiplet), 3.928-4.144 ppm (1H, multiplet), 4.461-4.813 ppm (1H, multiplet), 5.574-5.640 ppm (1H, multiplet)
(4) Elemental Analysis (Theoretical Values)
Ru: 25.5% (25.3%), C: 42.0% (42.1%), H: 4.3% (4.1%), F: 28.2 (28.5%)

[Production Example 2] Production of Compound No. 106

Under an Ar atmosphere, 10 g of dichlorodi-μ-chlorobis [(1, 2, 3, 6, 7, 8-η-2,7-dimethyl-2,6-octadiene)-1,8-diyl] diruthenium(IV) and 19 g of lithium carbonate were added to a 1 L four-necked reaction flask. Then, 405 ml of ethanol, 13.9 g of 2,4-dimethylhexa-1,3-diene, and 0.7 g of acetonitrile were added to the mixture. The reaction solution was heated and stirred at 90° C. for 5 hours. After the heating and stirring, the solvent was distilled off from the reaction solution in an oil bath at 90° C. under reduced pressure, and 200 ml of dichloromethane was added to the obtained residue, followed by filtration. After the filtration, the solvent was distilled off from the filtrate in an oil bath at 55° C. under normal pressure. After the removal of the solvent, distillation was performed in an oil bath at 130° C. and 15 Pa to obtain Compound No. 106 as a pale yellow liquid (yield: 2.80 g, percent yield: 44.2%).
(Analytic Values)
(1) Normal-Pressure TG-DTA
50% mass loss temperature: 220° C. (760 Torr, Ar flow rate: 100 ml/min, temperature increase rate: 10° C./min)
(2) Reduced-Pressure TG-DTA
50% mass loss temperature: 130° C. (10 Torr, Ar flow rate: 50 ml/min, temperature increase rate: 10° C./min)
(3) $^1$H-NMR (Deuterated Benzene)
0.696-1.031 ppm (4H, multiplet), 1.113-1.172 ppm (6H, quartet), 1.613-1.868 ppm (10H, multiplet), 2.434-2.988 ppm (4H, multiplet), 4.638 ppm (2H, singlet)
(4) Elemental Analysis (Theoretical Values)
Ru: 31.9% (31.7%), C: 60.4% (60.2%), H: 7.7% (8.1%)

[Evaluation Examples 1 and 2 and Comparative Evaluation Example 1] Evaluation of Physical Properties of Ruthenium Compounds The states of Compound No. 37 and No. 106 of the present invention obtained in Production Examples 1 and 2, and Comparative Compound 1 below at 25° C. were visually observed. Compounds that were solids at 25° C. were measured for their melting points. In addition, each thermal decomposition start temperature was measured through use of a DSC measuring device. Those results and each mass 50% reduction temperature (TG$_{50}$) measured by reduced-pressure TG-DTA are shown in Table 1. In the chemical formula of Comparative Compound 1 below, "Me" represents a methyl group.

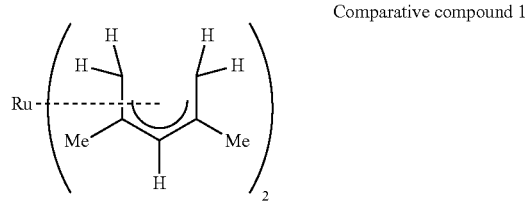

Comparative compound 1

TABLE 1

| | Compound | State at 25° C. | Melting point/ ° C. | Thermal decomposition start temperature/ ° C. | TG$_{50}$/ ° C. |
|---|---|---|---|---|---|
| Evaluation Example 1 | No. 37 | Solid | 55 | 250 | 105 |
| Evaluation Example 2 | No. 106 | Liquid | — | 235 | 130 |
| Comparative Evaluation Example 1 | Comparative compound 1 | Solid | 90 | 220 | 135 |

As shown in Table 1, Compound No. 106 was a liquid at 25° C. In addition, Compound No. 37 was a solid at 25° C., but had a relatively low melting point of 55° C. Meanwhile, Comparative Compound 1 had a melting point of 90° C. or more, which was much higher than that of the product of the present invention. In addition, Compounds No. 37 and No. 106 each had a thermal decomposition start temperature higher than that of Comparative Compound 1 by 15° C. or more, and in particular, Compound No. 37 had a thermal decomposition start temperature higher than that of Comparative Compound 1 by 30° C.

In addition, regarding TG$_{50}$, it was found that the values of Compounds No. 37 and No. 106 were lower than that of Comparative Compound 1, and in particular, the value of Compound No. 37 was lower than that of Comparative Compound 1 by 30° C. From those results, it was found that Compounds No. 37 and No. 106 were each excellent as a chemical vapor deposition raw material because of a lower melting point, higher thermal stability, and a larger vapor pressure as compared to those of Comparative Compound 1, and Compound No. 37 was particularly excellent.

[Examples 1 and 2 and Comparative Example 1]
Evaluation of Thin-Film by ALD Method A ruthenium nitride thin-film was produced on a silicon substrate by the ALD method under the following conditions through use of an ALD apparatus illustrated in FIG. 1 with each of Compounds No. 37 and No. 106, and Comparative Compound 1 being used as a chemical vapor deposition raw material. Regarding each of the obtained thin-films, a film thickness was measured by an X-ray reflectivity method, a compound of the thin-film was identified by an X-ray diffraction method, and the content of carbon in the thin-film was measured by X-ray photoelectron spectroscopy. The results are shown in Table 2.

(Conditions)
Reaction temperature (substrate temperature): 200° C., reactive gas: ammonia (Steps)
A series of steps including the following (1) to (4) was defined as one cycle, and this cycle was repeated 150 times:

(1) vapor of a chemical vapor deposition raw material vaporized under the conditions of a raw material container heating temperature of 100° C. and a raw material container internal pressure of 100 Pa is introduced, and the raw material is deposited at a system pressure of 100 Pa for 30 seconds;

(2) an unreacted raw material which has not been deposited is removed through argon purging for 10 seconds;

(3) a reactive gas is introduced and subjected to a reaction at a system pressure of 100 Pa for 30 seconds; and (4) the unreacted raw material is removed through argon purging for 10 seconds.

TABLE 2

| | Chemical vapor deposition raw material | Film thickness of thin-film | Compound of thin-film | Content of carbon in thin-film |
|---|---|---|---|---|
| Example 1 | Compound No. 37 | 7.5 nm | Metal ruthenium | Undetectable*[1] |
| Example 2 | Compound No. 106 | 5.5 nm | Metal ruthenium | Undetectable*[1] |
| Comparative Example 1 | Comparative compound 1 | 2.5 nm | Metal ruthenium | 10 atm % |

*[1]The detection limit is 0.1 atm %.

The content of carbon in the thin-film obtained by the ALD method is 10 atm % or more in Comparative Example 1, whereas the content of carbon is not more than 0.1 atm % that is the detection limit in Examples 1 and 2. That is, it was shown that a high-quality thin-film can be obtained through use of the ruthenium compound of the present invention in addition, the fil thickness of the obtained thin-film is 2.5 nm in Comparative Example 1, whereas the film thickness is 5.5 nm or more in Examples 1 and 2. Thus, the thin-film was obtained with high productivity through use of the ruthenium compound of the present invention. In particular, the thin-film was able to be obtained with higher productivity when Compound No. 37 was used as a chemical vapor deposition raw material, and hence it was shown that Compound No. 37 was excellent as a chemical vapor deposition raw material.

The invention claimed is:

1. A ruthenium compound represented by the following general formula (2):

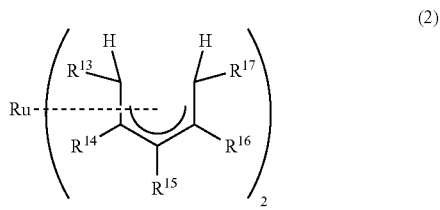

where $R^{13}$ and $R^{15}$ represent hydrogen atoms, and $R^{14}$, $R^{16}$ and $R^{17}$ represent methyl groups.

2. A thin-film forming raw material, comprising the ruthenium compound of claim 1.

3. A method of producing a thin-film containing ruthenium atoms on a surface of a substrate, comprising the steps of:
vaporizing the thin-film forming raw material of claim 2;
introducing vapor containing a ruthenium compound obtained in the vaporization step into a film formation chamber in which the substrate is set; and
subjecting the ruthenium compound to decomposition and/or a chemical reaction, to thereby form the thin-film containing ruthenium atoms on the surface of the substrate.

* * * * *